(12) United States Patent
Malliga et al.

(10) Patent No.: US 10,313,190 B2
(45) Date of Patent: Jun. 4, 2019

(54) TECHNIQUES OF PRESERVING AND RESTORING CUSTOMIZED CONFIGURATIONS OF THIN CLIENT AT RESTORE TIME POINTS

(71) Applicant: American Megatrends, Inc., Norcross, GA (US)

(72) Inventors: Manikandan Ganesan Malliga, Dindigul (IN); Balasubramanian Chandrasekaran, Chennai (IN); Yugender P. Subramanian, Norcross, GA (US); Varadachari Sudan Ayanam, Suwanee, GA (US)

(73) Assignee: AMERICAN MEGATRENDS, INC., Norcross, GA (US)

( * ) Notice: Subject to any disclaimer, the term of this patent is extended or adjusted under 35 U.S.C. 154(b) by 165 days.

(21) Appl. No.: 15/581,417

(22) Filed: Apr. 28, 2017

(65) Prior Publication Data

US 2018/0316560 A1 Nov. 1, 2018

(51) Int. Cl.
*G06F 15/177* (2006.01)
*H04L 12/24* (2006.01)
*G06F 17/50* (2006.01)
*H04L 29/06* (2006.01)
*G06F 15/78* (2006.01)

(52) U.S. Cl.
CPC ...... *H04L 41/0863* (2013.01); *G06F 17/5054* (2013.01); *H04L 41/0856* (2013.01); *H04L 41/0859* (2013.01); *H04L 41/0866* (2013.01); *G06F 15/7867* (2013.01); *H04L 41/082* (2013.01); *H04L 67/42* (2013.01)

(58) Field of Classification Search
CPC ............... H04L 41/0866; H04L 41/082; G06F 17/5054; G06F 15/7867
IPC ..................................................... G06F 15/177
See application file for complete search history.

(56) References Cited

U.S. PATENT DOCUMENTS 9,419,856 B1 * 8/2016 Chawla ............... H04L 41/0866
2017/0061055 A1 * 3/2017 Khan ................... G06F 17/5054

* cited by examiner

*Primary Examiner* — Kyung H Shin
(74) *Attorney, Agent, or Firm* — Locke Lord LLP; Tim Tingkang Xia, Esq.

(57) ABSTRACT

In an aspect of the disclosure, a method, a computer-readable medium, and an apparatus are provided. The apparatus may be a thin client. The thin client captures, at a first restore time point, customized configurations of the thin client stored at a first storage location of the thin client. The thin client then obtains first default configurations of the thin client that are in use. The thin client further determines a difference between the customized configurations and the first default configurations. The thin client stores the difference between the customized configurations and the first default configurations as a configurations difference in association with the first restore time point at a second storage location of the thin client.

17 Claims, 9 Drawing Sheets

TECHNIQUES OF PRESERVING AND RESTORING CUSTOMIZED CONFIGURATIONS OF THIN CLIENT AT RESTORE TIME POINTS

FIELD

The present disclosure relates generally to networked computer systems, and more particularly, to techniques of preserving and restoring customized configurations of a thin client at restore time points.

BACKGROUND

The statements in this section merely provide background information related to the present disclosure and may not constitute prior art.

Computers are becoming increasingly ubiquitous, and are becoming pervasively integrated into the environment. For many users, this introduces the issue of configuring, maintaining and managing operating systems, applications and data on a number of computers.

A thin client device or zero client device is a client computer that operates in a client-server architecture. Thin clients are arranged to perform as little processing as possible, and the majority of the processing is performed by a server to which the thin client device is connected. This is in contrast to regular desktop or laptop computers (which can be considered "thick" clients), as the majority of the processing is performed on a local processor.

As the user's data, applications and operating systems are installed centrally on the server in a thin client architecture, the issue of configuring, maintaining and managing the computers becomes more manageable for the user. A single server can be arranged to support a large number of thin client devices. Furthermore, the lower amount of processing power used by a thin client device enables it to be made smaller and more power efficient than an equivalent "thick" client.

Thin/Zero clients come with default values for user configurable settings. A user can make changes to these settings and save them on the thin client. A user may want to revert to the previous settings the changes because those changes do not work for the current setup or for any other reasons. Therefore, there is a need for a mechanism that can restore the customized configurations in use back to one of the previously saved snapshots of customized configurations.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a thin client. The thin client captures, at a first restore time point, customized configurations of the thin client stored at a first storage location of the thin client. The thin client then obtains first default configurations of the thin client that are in use. The thin client further determines a difference between the customized configurations and the first default configurations. The thin client stores the difference between the customized configurations and the first default configurations as a configurations difference in association with the first restore time point at a second storage location of the thin client.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of computer systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

Figure 1:
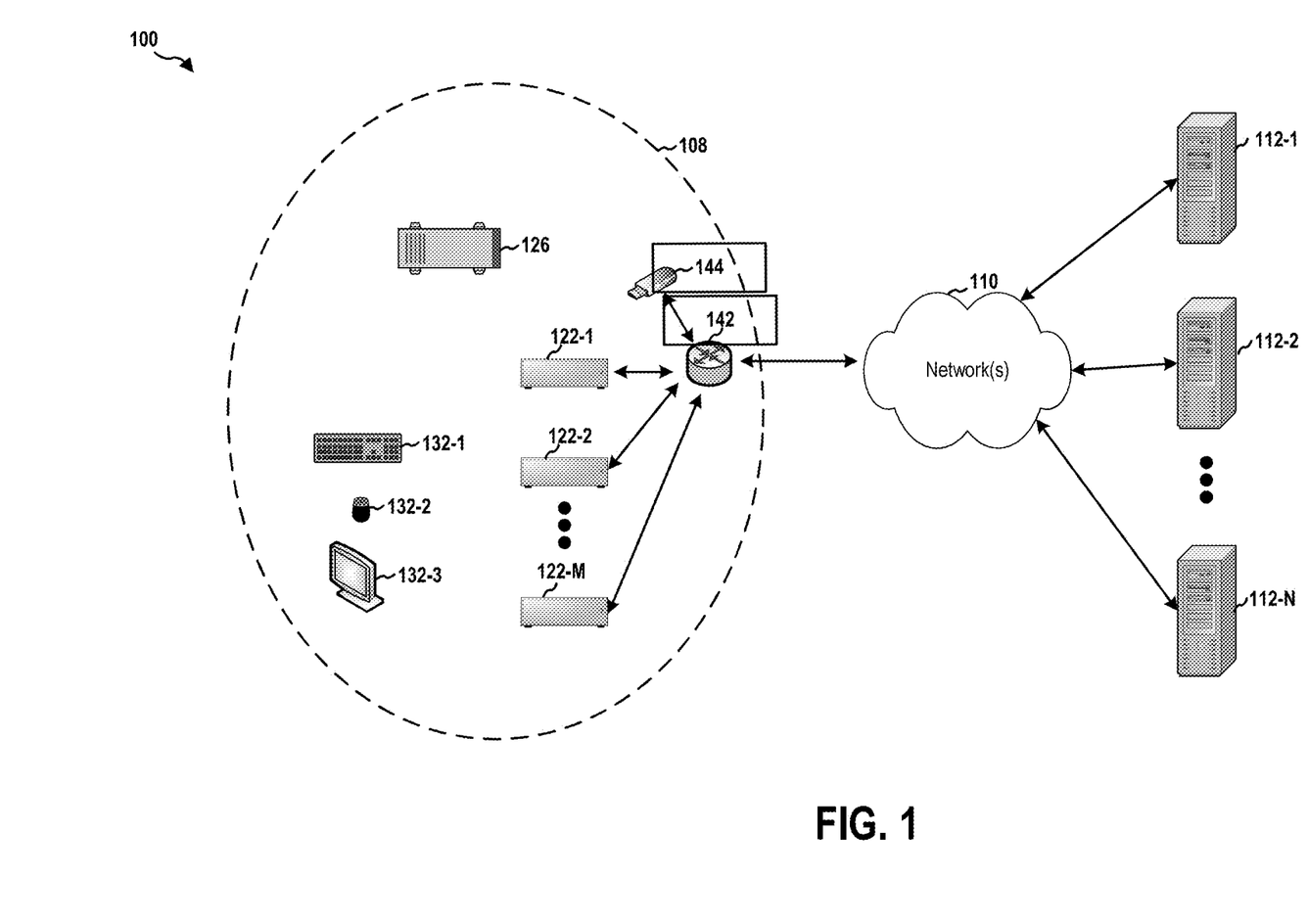
FIG. 1 is a diagram illustrating networked thin clients and remote machines.

FIG. 1 is a diagram 100 illustrating networked thin clients and remote machines. One or more of M thin clients 122-1, 122-2, . . . , 122-M each may be utilized to establish a respective session with one or more of N remote machines 112-1, 112-2, . . . , 112-N, M and N each being a respective integer greater than 0. In certain configurations, the thin clients 122-1, 122-2, . . . , 122-M may be in communication with the remote machines 112-1, 112-2, . . . , 112-N through a network 110 (e.g., Internet). Each of the remote machines 112-1, 112-2, . . . , 112-N may be a virtual machine or a physical machine. Each of the thin clients 122-1, 122-2, . . . , 122-M may be wirelessly connected with one or more peripherals, e.g., peripherals 132-1, 132-2, 132-3.

Further, a remote machine manager 126 may be utilized to manage the thin clients 122-1, 122-2, . . . , 122-M, the remote machines 112-1, 112-2, . . . , 112-N, and/or the peripherals 132-1, 132-2, 132-3. The networked peripherals, the remote machine manager 126, and the thin clients 122-1, 122-2, . . . , 122-M may be in the same LAN 108, e.g., a wireless local area network (WLAN) or a wired LAN. In certain configurations, those devices may be in a different type of network.

Figure 2:
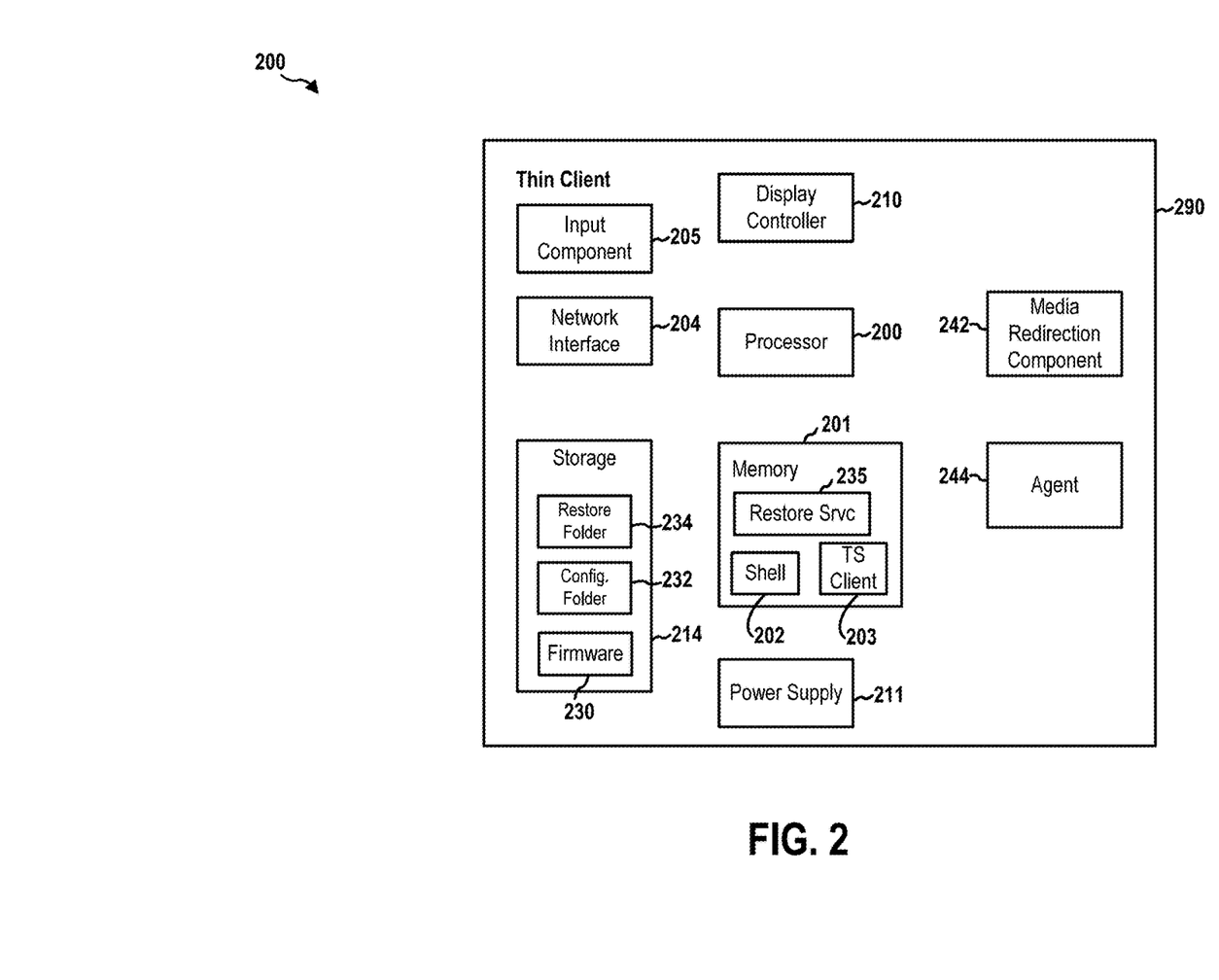
FIG. 2 is a diagram illustrating an exemplary thin client.

FIG. 2 is a diagram 200 illustrating an exemplary thin client. A thin client 290, which may be any one of the thin clients 122-1, 122-2, . . . , 122-M, includes one or more processors 200, which can be microprocessors, controllers or any other suitable type of processors for processing computing executable instructions to control the operation of the device. The computer executable instructions can be provided using any computer-readable media, such as memory 201. The memory 201 is of any suitable type such as random access memory (RAM). The thin client 290 may also include a storage component 214, which may be a storage device of any type such as a magnetic or optical storage device, a hard disk drive, a CD, DVD, or other disc drive, a flash memory, an EPROM, or an EEPROM.

The thin client 290 may store firmware 230 in the storage component 214. When the processor 200 executes the firmware 230, the processor 200 loads code and data of the firmware 230 into the memory 201. This example shows that the firmware 230 provides in the memory 201, among other components, a software shell 202, a terminal server (TS) client 203 application, and a restore service 235, which are described in more detail infra. Further, as described infra, the executed firmware 230 may create or utilize a configuration folder 232 at the storage component 214 to store configurations of some or all components of the executed firmware 230. The restore service 235 can create or utilize a restore folder 234 at the storage component 214 to preserve captured configurations at one or more restore time points.

A network interface 204 enables the thin client 290 to communicate over a network (in particular a wireless network) with the remote machines 112-1, 112-2, . . . , 112-N. The network interface 204 can be, for example, a WLAN interface, a cellular radio interface, a personal area network (PAN) interface, or any other suitable interface for transmitting and receiving network data. Note that in other examples, a wireless network interface can be replaced with a wired communication interface.

The thin client 290 also includes an input component 205. The input component 205 can be wirelessly connected with input peripherals (e.g., the keyboard 132-1 and the mouse 132-2) and receive input from the input peripherals.

Image output of the thin client 290 can be provided by a display controller 210. The display controller 210 may send image signals to a display peripheral. In particular, the display controller 210 may send image packets to a WLAN display via the network interface 204. The thin client 290 further comprises a power supply 211 such as a battery or a wired power source.

The thin client 290 may also include a media redirect component 242 that redirects a media device to a remote machine. Further, the thin client 290 may also include an agent 244 that can be used to communicate with the remote machine manager 126.

Figure 3:
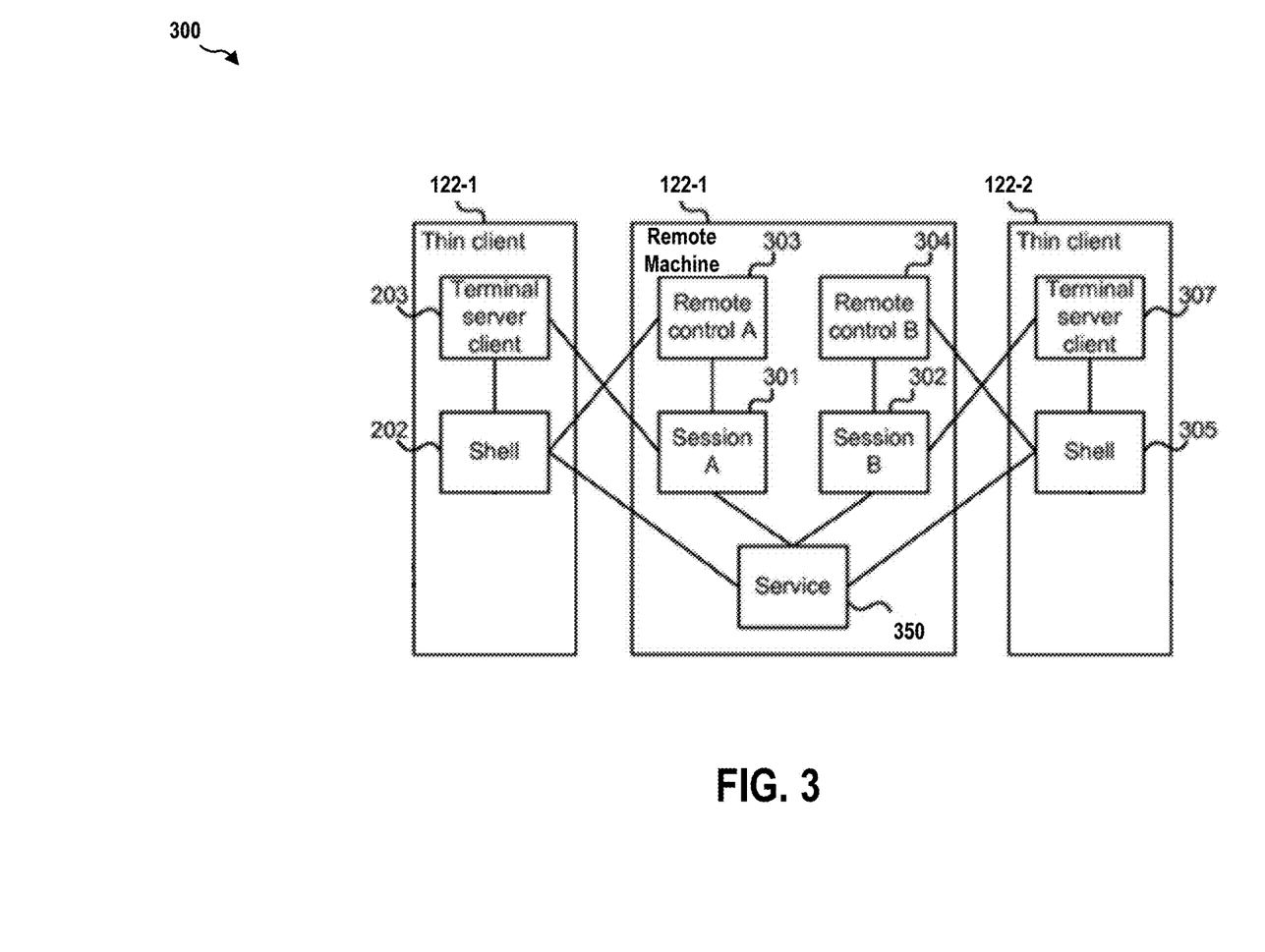
FIG. 3 is a diagram illustrating an example functional block diagram of elements in a thin client system.

FIG. 3 is a diagram 300 illustrating an example functional block diagram of the elements in a thin client system including the thin client 122-1 and the thin client 122-2 and the remote machine 112-1. The thin client 122-1 may include a shell 202 and a terminal server client 203, as described supra. The shell 202 is a lightweight control program that controls the basic operation of the thin client 122-1. In particular, the shell may determine what sessions are available on the remote machine 112-1, and may provide an interface on the display of the thin client 122-1 for the user to select a session to log into. The terminal server client 203 is a program that enables the user to interact with a particular session, and view the user interface of the session on the display of the thin client 122-1.

The remote machine 112-1 may include a software service 350 which is arranged to control and manage multiple sessions executed on the remote machine 112-1. In the example shown in FIG. 3, two sessions are running on the remote machine 112-1: session A 301 and session B 302. In other examples, more sessions could also be running on the remote machine 112-1 as well. Also, note that the service 350 and sessions 301, 302 do not have to be running on the same remote machine 112-1 as shown in FIG. 3, but can be running on different remote machines. For example, instead of on the remote machine 112-1, the session 302 may be running on the remote machine 112-2.

Each session corresponds to applications and data that are accessible to one or more users. In certain configurations, a session may include a user interface of a remote desktop (i.e., a complete view of a computer desktop with several accessible applications). In certain configurations, a session may only include one or more individual applications. For example, session A 301 may correspond to a first user using a word processing application in a desktop, and session B 302 may be a stand-alone calendar application that is accessible to several users. In one example, the session is provided to the TS client 203 using a remote session protocol such as the remote desktop protocol (RDP) or virtual network computing (VNC), which may enable both desktop and application remote operation.

Each session 301, 302 on the remote machine 112-1 is optionally executing a software remote control 303, 304. The remote control 303, 304 enables the user in a session to change settings of the thin client device (even though the remote control is on the remote machine, and not on the thin client device itself). For example, these settings may include display settings at the thin client 122-1.

In the example of FIG. 3, the thin client 122-1 is accessing session A 301. The shell 202 receives data from the sensing device 206, and communicates with the TS client 203 and the service 301 on the remote machine 112-1. Session A 301 communicates with the TS client 203 and remote control A 303. Remote control A 301 communicates with the shell 202 on the thin client 122-1.

The remote machine 112-1 in FIG. 3 is also shown connected to the thin client 122-2. The thin client 122-2 has a similar structure to the thin client 122-1 in that it includes a shell 305 and a TS client 307. The thin client 122-2 is shown accessing session B 302 in FIG. 3.

Figure 4:
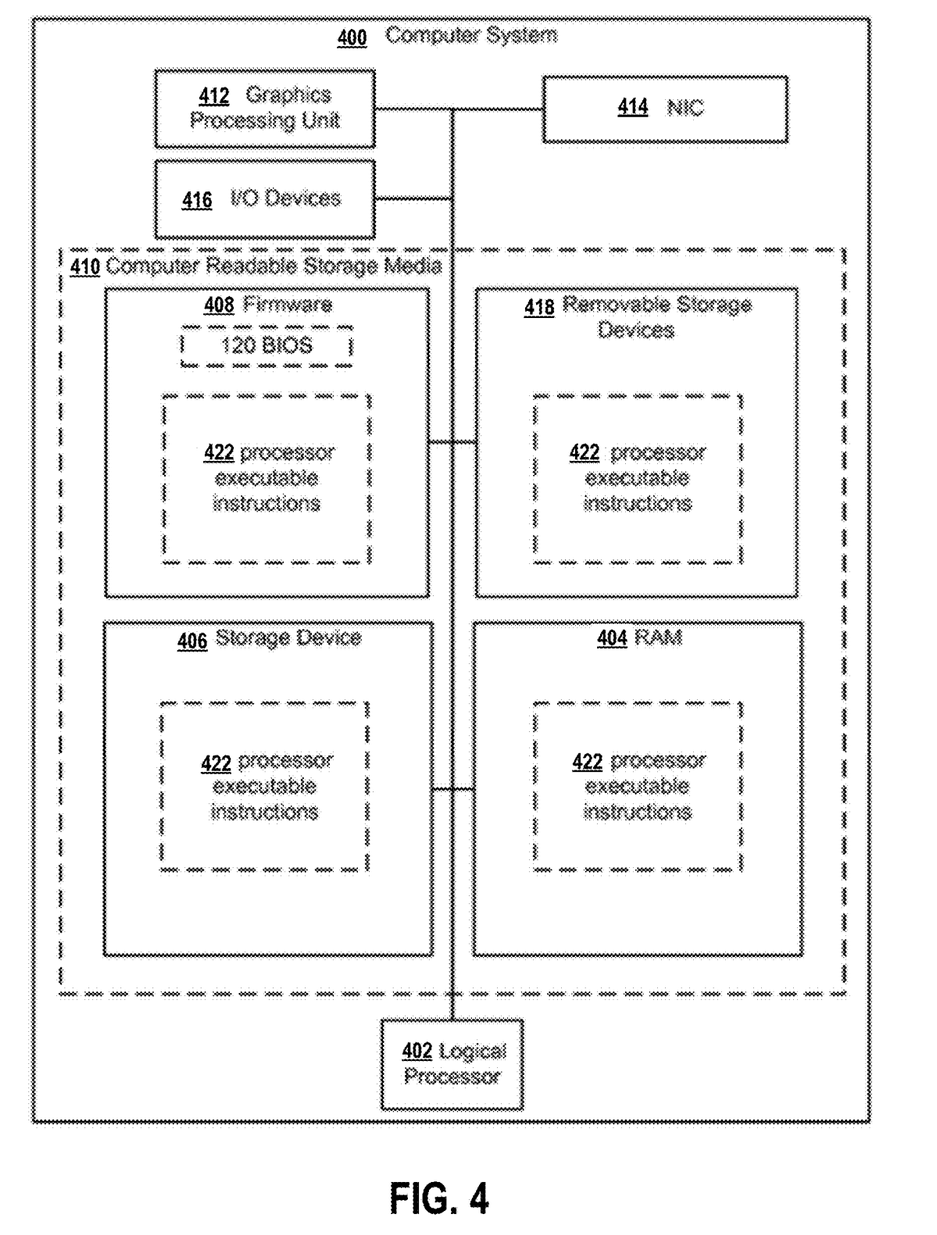
FIG. 4 is a diagram illustrating an exemplary computing system.

As described supra, each of the remote machines 112-1, 112-2, . . . , 112-N may be a virtual machine or a physical machine. Referring now to FIG. 4, an exemplary computing system 400 (i.e., a physical machine) is depicted. Computer system 400 can include logical processor 402, e.g., an execution core. While one logical processor 402 is illustrated, in other embodiments computer system 400 may have multiple logical processors, e.g., multiple execution cores per processor substrate and/or multiple processor substrates that could each have multiple execution cores. As shown by the FIG. 4, various computer readable storage media 410 can be interconnected by one or more system busses which couple various system components to the logical processor 402. The system buses may be any of several types of bus structures including a memory bus or memory controller, a peripheral bus, and a local bus using any of a variety of bus architectures. In example embodiments, the computer readable storage media 410 can include for example, random access memory (RAM) 404, storage device 406, e.g., electromechanical hard drive, solid state hard drive, etc., firmware 408, e.g., FLASH RAM or ROM, and removable storage devices 418 such as, for example, CD-ROMs, floppy disks, DVDs, FLASH drives, external storage devices, etc. Other types of computer readable storage media can be used such as magnetic cassettes, flash memory cards, and/or digital video disks.

The computer readable storage media 410 can provide nonvolatile and volatile storage of processor executable instructions 422, data structures, program modules and other data for the computer 400 such as executable instructions that effectuate manager 550 described in the following figures. A basic input/output system (BIOS) 420, containing the basic routines that help to transfer information between elements within the computer system 400, such as during start up, can be stored in firmware 408. A number of programs may be stored on firmware 408, storage device 406, RAM 404, and/or removable storage devices 418, and executed by logical processor 402 including an operating system and/or application programs.

Commands and information may be received by computer 400 through input devices 416 which can include, but are not limited to, a keyboard and pointing device. Other input devices may include a microphone, joystick, game pad, scanner or the like. These and other input devices are often connected to logical processor 402 through a serial port interface that is coupled to the system bus, but may be connected by other interfaces, such as a parallel port, game port, or universal serial bus (USB). A display or other type of display device can also be connected to the system bus via an interface, such as a video adapter which can be part of, or connected to, a graphics processor unit (GPU) 412. In addition to the display, computers typically include other peripheral output devices, such as speakers and printers (not shown). The exemplary system of FIG. 4 can also include a host adapter, Small Computer System Interface (SCSI) bus, and an external storage device connected to the SCSI bus.

Computer system 400 may operate in a networked environment using logical connections to one or more remote computers. The remote computer may be another computer, a server, a router, a network PC, a peer device or other common network node, and typically can include many or all of the elements described above relative to computer system 400.

When used in a LAN or WAN networking environment, computer system 400 can be connected to the LAN or WAN through network interface card (NIC) 414. The NIC 414, which may be internal or external, can be connected to the system bus. In a networked environment, program modules depicted relative to the computer system 400, or portions thereof, may be stored in the remote memory storage device. It will be appreciated that the network connections described here are exemplary and other means of establishing a communications link between the computers may be used. Moreover, while it is envisioned that numerous embodiments of the present disclosure are particularly well-suited for computerized systems, nothing in this document is intended to limit the disclosure to such embodiments.

Figure 5:
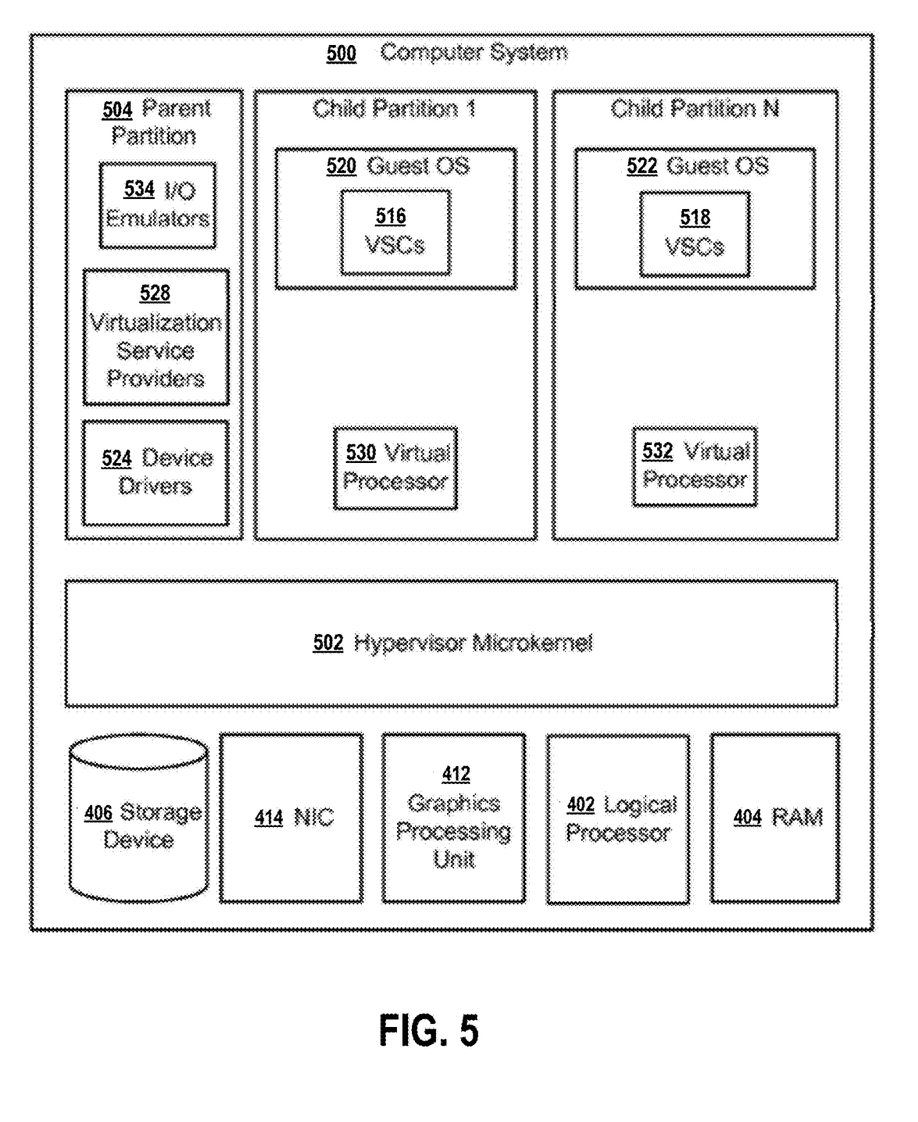
FIG. 5 is a diagram illustrating a virtual machine computing system.

Turning to FIG. 5, hypervisor microkernel 502 can be configured to control and arbitrate access to the hardware of computer system 500. The computer system 500 may employ the storage device 406, the NIC 414, the GPU 412, the logic processor 402, and the RAM 404 as described supra. Broadly, hypervisor microkernel 502 can generate execution environments called partitions such as child partition 1 through child partition N (where N is an integer greater than 1). In embodiments, a child partition is the basic unit of isolation supported by hypervisor microkernel 502. Hypervisor microkernel 502 can isolate processes in one partition from accessing another partition's resources, e.g., a guest operating system in one partition may be isolated from the memory of another partition and thus may not be able to detect memory addresses outside of its partition. Each child partition can be mapped to a set of hardware resources, e.g., memory, devices, logical processor cycles, etc., that is under control of the hypervisor microkernel 502. In embodiments hypervisor microkernel 502 can be a stand-alone software product, a part of an operating system, embedded within firmware of the motherboard, specialized integrated circuits, or a combination thereof.

Hypervisor microkernel 502 can enforce partitioning by restricting a guest operating system's view of system memory. Guest physical memory (GPM) is a partition's view of memory that is controlled by hypervisor microkernel 502. System physical memory (SPM) is the memory from the view of hypervisor microkernel 502. Pages are fixed length blocks of memory with starting and ending addresses. System physical memory can be allocated to virtual machines as guest physical memory. Thus, a page of memory allocated to a virtual machine will have a guest physical address (the address used by the virtual machine) and a system physical address (the actual address of the page). The term guest physical memory is a shorthand way of describe a page of memory from the viewpoint of a virtual machine and the term system physical memory is shorthand way of describing a page of memory from the viewpoint of the physical system.

A guest operating system may virtualize guest physical memory. Virtual memory is a management technique that allows an operating system to over commit memory and to give an application sole access to a contiguous working memory. In a virtualized environment, a guest operating system can use one or more page tables to translate virtual addresses, known as virtual guest addresses into guest physical addresses. Thus, a memory address may have a guest virtual address, a guest physical address, and a system physical address in an exemplary embodiment.

In the depicted example, parent partition component 504, which can also be also thought of as similar to domain 0 of Xen's open source hypervisor is illustrated. Parent partition 504 in this operational environment can be configured to provide resources to guest operating systems executing in the child partitions 1-N by using virtualization service providers 528 (VSPs) that are typically referred to as back-end drivers in the open source community. Broadly, VSPs 528 can be used to multiplex the interfaces to the hardware resources by way of virtualization service clients (VSCs) (typically referred to as front-end drivers in the open source community) and communicate with the virtualization service clients via communication protocols. As shown by the figures, virtualization service clients can execute within the context of guest operating systems. These drivers are different than the rest of the drivers in the guest in that they may be supplied with a hypervisor, not with a guest.

As shown by the figure, emulators 534, e.g., virtualized IDE devices, virtualized video adaptors, virtualized NICs, etc., can be configured to run within the parent partition 504 and attached to resources available to guest operating systems 520 and 522. For example, when a guest OS touches a register of a virtual device or memory mapped to the virtual device microkernel hypervisor 502 can intercept the request and pass the values the guest attempted to write to an associated emulator.

Each child partition can include one or more virtual processors (530 and 532) that guest operating systems (520 and 522) can manage and schedule threads to execute thereon. Generally, the virtual processors are executable instructions and associated state information that provide a representation of a physical processor with a specific architecture. For example, one virtual machine may have a virtual processor having characteristics of an INTEL x86 processor, whereas another virtual processor may have the characteristics of an ARM processor. The virtual processors in this example can be mapped to logical processors of the computer system such that the instructions that effectuate the virtual processors will be backed by logical processors. Thus, in an embodiment including multiple logical processors, virtual processors can be simultaneously executed by logical processors while, for example, other logical processor execute hypervisor instructions. The combination of virtual processors and memory in a partition can be considered a virtual machine.

Guest operating systems (520 and 522) can be any operating system such as, for example, operating systems from MICROSOFT, APPLE, the open source community, etc. The guest operating systems can include user/kernel modes of operation and can have kernels that can include schedulers, memory managers, etc. Generally speaking, kernel mode can include an execution mode in a logical processor that grants access to at least privileged processor instructions. Each guest operating system can have associated file systems that can have applications stored thereon such as terminal servers, e-commerce servers, email servers, etc., and the guest operating systems themselves. The guest operating systems can schedule threads to execute on the virtual processors and instances of such applications can be effectuated.

Figure 6:
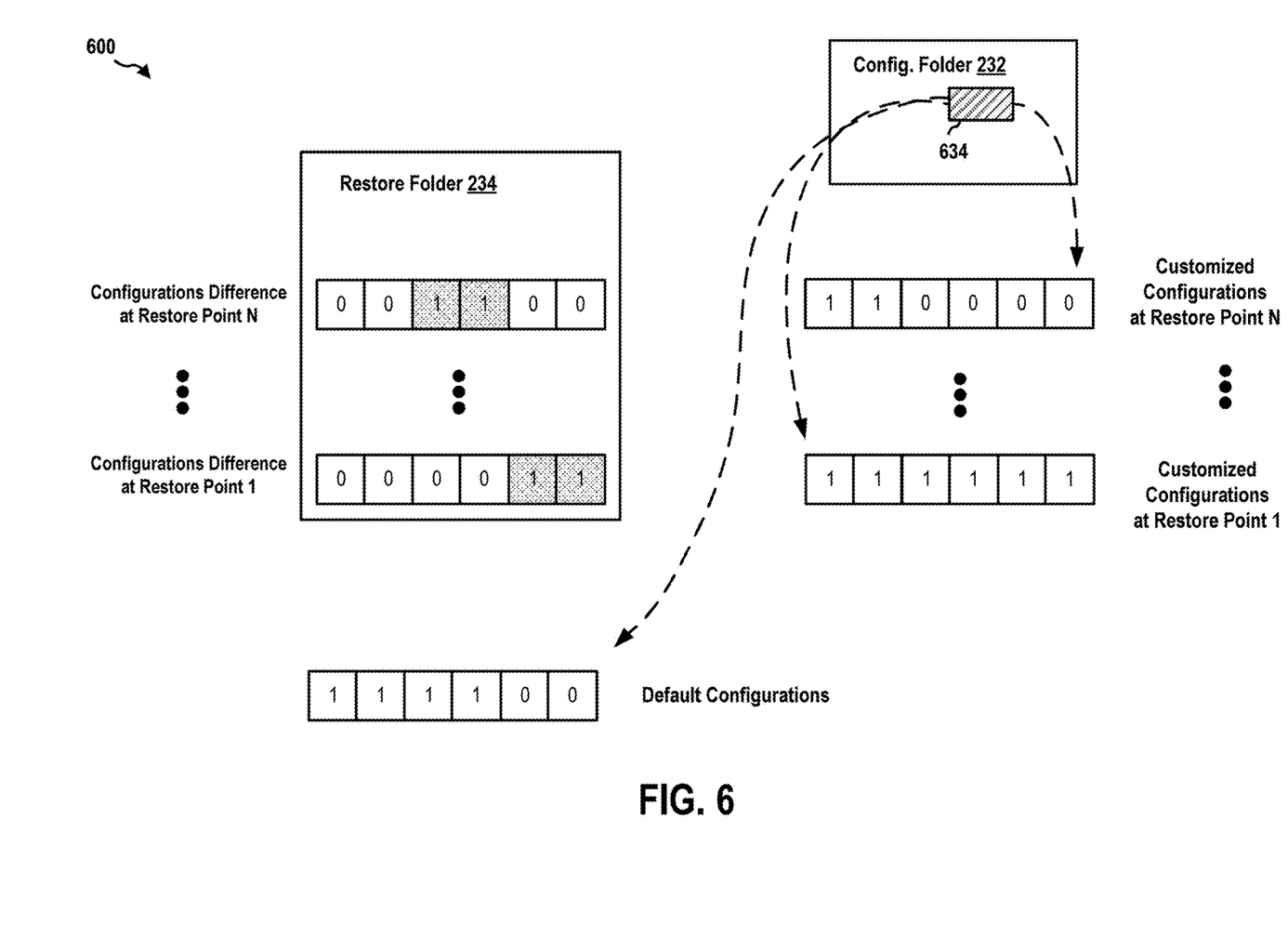
FIG. 6 is a diagram illustrating operations of the thin client.

FIG. 6 is a diagram 600 illustrating operations of the thin client 290. As described supra, the executed firmware 230 of the thin client 290 may use the configuration folder 232 to store configurations or setting used by components of the executed firmware 230. When the thin client 290 is initially set up (prior to user customization), the executed firmware 230 may store default configurations and setting for the components. For example, the configurations may indicate a default remote machine of the remote machines 112-1, 112-2, . . . , 112-N to be used by the thin client 290. The configurations may also include necessary settings for the TS client 203 such as a default communication protocol (e.g., RDP or VNC) to be used to connect with a remote machine. Those configurations may include the number of monitors to be used by the thin client 290 and the resolution for each of the monitors. The configurations may also include user names, IP addresses, certificates, keys, known hosts, etc. That is, all data that can be saved by users in the thin client 290 can be considered as configurations or settings discussed here. The restore service 235 may store a copy of default configurations in use at the storage component 214.

Subsequently, when a user is using the thin client 290, the user may customize or modify the configurations in use. For example, the default settings for a communication protocol may be RDP, and the user may change the default communication protocol to VNC. Such user modifications would be saved at the configuration folder 232, which now stores customized configurations instead of the default configurations.

The restore service 235 may preserve the customized configurations stored in the restore folder 234 at various restore time points such as restore time points 1 to N shown in FIG. 6. In certain configurations, the restore time points 1 to N are time points specified by a predetermined schedule (e.g., daily at 1 AM). In certain configurations, each restore time point is a time point selected by the restore service 235 after the restore service 235 has determined that the customized configurations stored at the configuration folder 232 have been modified.

In particular, at each of the restore time points 1 to N, the restore service 235 may obtain (e.g., retrieve into the memory 201) a copy of the default configurations that are in use from the storage component 214. Further, the restore service 235 may obtain a copy of the customized configurations that are currently stored in the configuration folder 232. The restore service 235 may compare the obtained customized configurations with the obtained default configurations to determine the difference between the two. The restore service 235 then may store the difference in the restore folder 234 as a configurations difference of that restore time point (i.e., in association with that restore time point).

Using an area 634 of the configuration folder 232 as an example, FIG. 6 shows that the values stored in the area 634 of the copy the default configurations in use are "111100". Those values may, for example, indicate the identity of a default remote machine (e.g., the remote machine 112-1) with which the thin client 290 is to be connected. Subsequently, a user changes the values in the area 634 of the configuration folder 232 to "111111" (e.g., indicating the remote machine 112-2). After the change is made, at the restore time point 1, the restore service 235 retrieves a copy of the customized configurations that are currently stored in the configuration folder 232. The restore service 235 then compares the copy of the customized configurations with the copy of the default configurations to determine the difference between the two. In this example, specifically with respect to the area 634, the restore service 235 determines that the difference is "000011". In other words, the values of the default configurations plus the difference equals the values of the customized configurations (i.e., "111100"+ "000011"="111111"). Then, the restore service 235 stores, in the restore folder 234, the difference between the two copies (include the difference at the area 634) as a configurations difference with an indication that the stored configurations difference is for the restore time point 1 (i.e., in association with the restore time point 1). Further, the difference between the two copies may be compressed or processed such that only the bits indicating the changes and indications of the location of the bits (e.g., "11" at the last two bits of the area 634) are retained in the configurations difference in order to save storage space.

In this example, sometime later, the user changes the values in the area 634 of the configuration folder 232 to "110000" (e.g., indicating the remote machine 112-N). At the restore time point N, which is the next restore time point after the change is made, the restore service 235 retrieves a copy of the customized configurations that are currently stored in the configuration folder 232. The restore service 235 then compares the copy of the customized configurations with the copy of the default configurations to determine the difference between the two. Specifically with respect to the area 634, the restore service 235 determines that the difference is "001100". In other words, the values of the default configurations plus the difference equals the values of the customized configurations (i.e., "111100"+ "001100"="110000"). Then, the restore service 235 stores, in the restore folder 234, the difference between the two copies (include the difference at the area 634) as a configurations difference with an indication that configurations difference is for the restore time point N (i.e., in association with the restore time point N). Similarly, the difference may be compressed.

Further, from time to time, the firmware 230 of the thin client 290 may be updated. Consequently, the default configurations of the firmware 230 may be updated as well. The restore service 235 can determine that the firmware 230 has been updated (e.g., based on a version number of the firmware 230). Upon such a determination, the restore service 235 obtains a current, updated copy of the default configurations that are in use. The restore service 235 also retrieves the copy of the previous copy of the default configurations stored in the storage component 214. Subsequently, the restore service 235 compare the updated default configurations with the previous default configurations to determine a difference between the two. The restore service 235 also replaces the copy of the previous default configurations stored in the storage component 214 with a copy of the updated default configurations.

The restore service 235 then updates the respective configurations difference associated with each of the restore time points 1 to N stored in the restore folder 234 based on the difference between the previous default configurations and the updated default configurations. In particular, the restore service 235 may subtract the difference between the previous default configurations and the updated default configurations from a particular configurations difference to obtain an updated configurations difference. After obtaining the updated configurations difference associated with a particular restore time point, the restore service 235 replaces the corresponding previous configurations difference stored in the restore folder 234 with the updated configurations difference for that particular restore time point.

Figure 7:
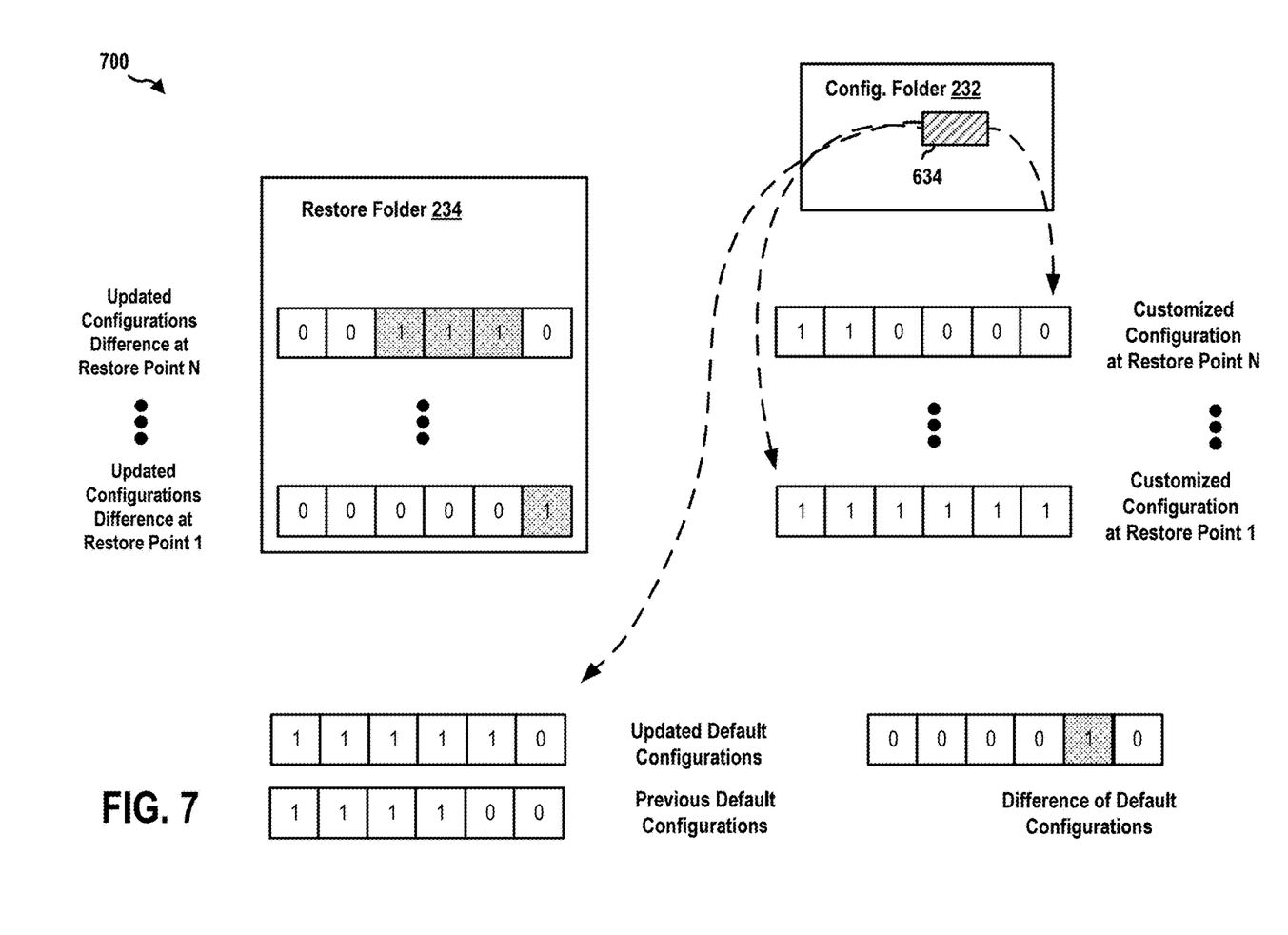
FIG. 7 is another diagram illustrating operations of the thin client.

FIG. 7 is another diagram 700 illustrating operations of the thin client 290. Again, using the area 634 of the configuration folder 232 as an example, FIG. 7 shows that the values in the area 634 of the updated default configurations are "111110". The restore service 235 determines the difference between the previous default configurations and the updated default configurations. The difference specifically for the area 634 is "000010". As described supra, the difference may be compressed. The previous configurations difference of the restore time point 1 stored in the restore folder 234 is "000011". Specifically with respect to the restore time point 1, the restore service 235 subtracts the difference (i.e., "000010") of the default configurations from the previous configurations difference (i.e., "000011") to generate the updated configurations difference (i.e., "000001") of the restore time point 1. With respect to the restore time point N, the restore service 235 subtracts the difference (i.e., "000010") of the default configurations from the previous configurations difference (i.e., "001100") to generate the updated configurations difference (i.e., "001110") of the restore time point 1. Similarly, the restore service 235 updates the copies of configurations difference of the other restore time points.

In various circumstances (e.g., where the thin client 290 fails to boot), a user may decide to restore the configurations of the thin client 290 to the customized configurations at a particular restore time point. The restore service 235, accordingly, may obtain the default configurations in use from the storage component 214 and the configurations difference of the particular restore time point from the restore folder 234. The restore service 235 may add the configurations difference to the default configurations to generate the complete customized configurations of the particular restore time point. The restore service 235 then replaces the customized configurations currently stored in the configuration folder 232 with the restored customized configurations of the particular restore time point.

In the example of FIG. 6, the restore service 235 may be instructed to restore the configurations in the configuration folder 232 to the customized configurations at the restore time point 1. Specifically with respect to the area 634, the restore service 235 adds the configurations difference (i.e., "000011") related to the area 634 at the restore time point 1 to the default configurations (i.e., "111100") of the area 634 to restore the customized configurations (i.e., "111111") of the area 634 at the restore time point 1. The restore service 235 then replaces the bits in the area 634 of the configuration folder 232 with the restored customized configurations at the restore time point 1.

In the example of FIG. 7, the restore service 235 may be instructed to restore the configurations in the configuration folder 232 to the customized configurations at the restore time point N. Specifically with respect to the area 634, the restore service 235 adds the configurations difference (i.e., "001110") related to the area 634 at the restore time point N to the updated default configurations (i.e., "111110") in the area 634 to restore the customized configurations (i.e., "111111") of the area 634 at the restore time point N. The restore service 235 then replaces the bits in the area 634 of the configuration folder 232 with the restored customized configurations of the restore time point N.

Figure 8:
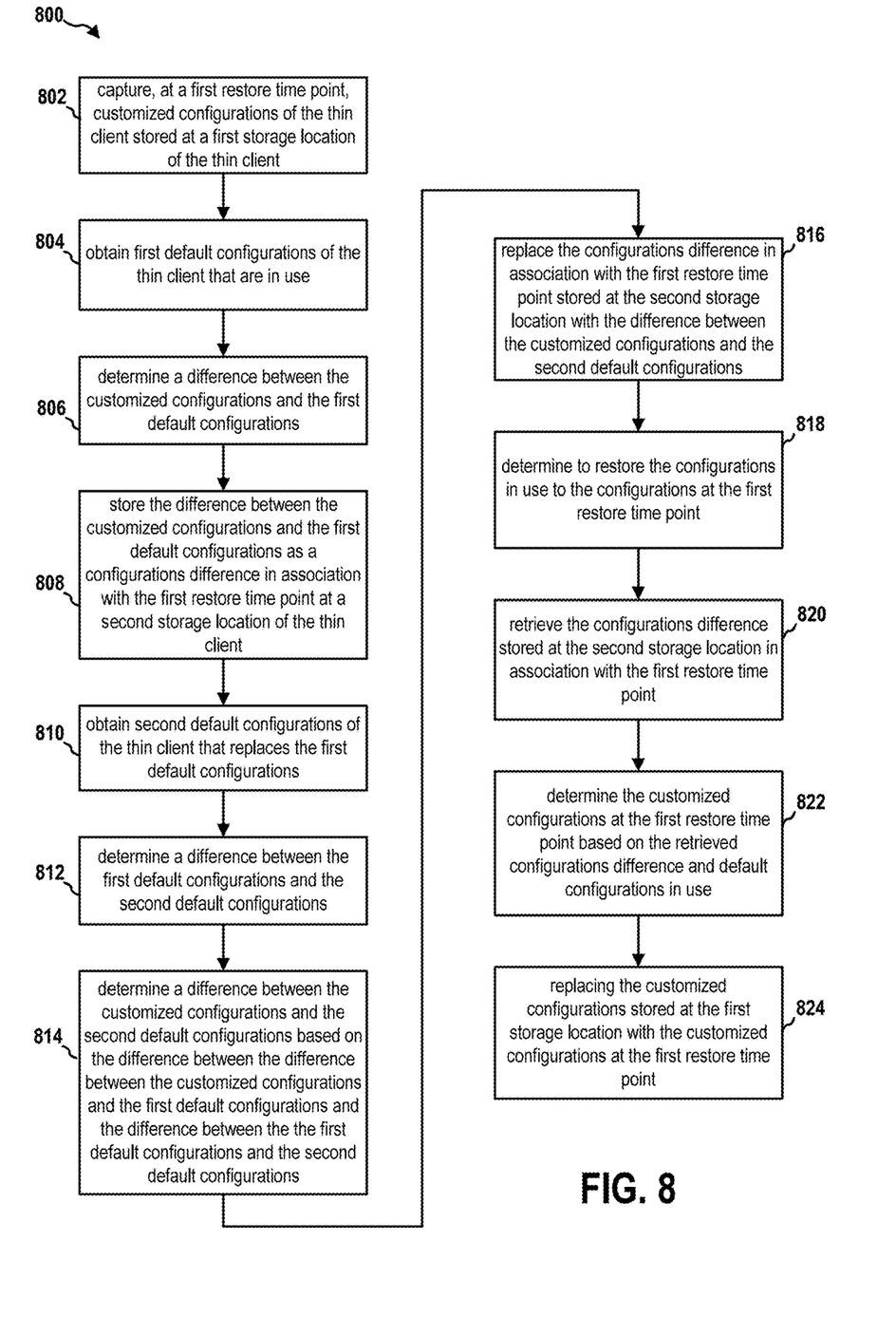
FIG. 8 is a flow chart of a method (process) for preserving customized configurations at a restore time point.

FIG. 8 is a flow chart 800 of a method (process) for preserving customized configurations at a restore time point. The method may be performed by a thin client (e.g., the thin client 122-1 and the apparatus 290/290'). At operation 802, the thin client captures, at a first restore time point (e.g., the restore time point 1), customized configurations of the thin client stored at a first storage location (e.g., the configuration folder 232) of the thin client. At operation 804, the thin client obtains first default configurations (e.g., the default configurations shown in FIG. 6) of the thin client that are in use. At operation 806, the thin client determines a difference between the customized configurations and the first default configurations. At operation 808, the thin client stores the difference between the customized configurations and the first default configurations as a configurations difference in association with the first restore time point at a second storage location (e.g., the restore folder 234) of the thin client.

In certain configurations, the thin client captures, at each of a plurality of restore time points in addition to the first restore time point (e.g., the restore time points 1 to N), respective customized configurations of the thin client stored at the first storage location. The thin client determines a respective difference between the respective customized configurations at each of the plurality of restore time points and the first default configurations. The thin client stores the respective difference between the respective customized configurations at each of the plurality of restore time points and the first default configurations as a configurations difference in association with that restore time point at a second storage location of the thin client. In certain configurations, the first restore time point and the plurality of restore time points are time points specified by a predetermined schedule. In certain configurations, each of the first restore time point and the plurality of restore time points is selected in response to a determination that the customized configurations stored at the first storage location have been modified.

In certain configurations, at operation 810, the thin client obtains second default configurations (e.g., the updated default configurations shown in FIG. 7) of the thin client that replaces the first default configurations. At operation 812, the thin client determines a difference between the first default configurations and the second default configurations. At operation 814, the thin client determines a difference between the customized configurations and the second default configurations based on the difference between the difference between the customized configurations and the first default configurations and the difference between the first default configurations and the second default configurations. At operation 816, the thin client replaces the configurations difference in association with the first restore time point stored at the second storage location with the difference between the customized configurations and the second default configurations.

In certain configurations, the thin client determines that the first default configurations have been changed to the second default configurations. The second default configurations are obtained in response to the determination.

In certain configurations, at operation 818, the thin client determines to restore the customized configurations stored at the first storage location to the customized configurations at the first restore time point. At operation 820, the thin client retrieves the configurations difference stored at the second storage location in association with the first restore time point. At operation 822, the thin client determines the customized configurations at the first restore time point based on the retrieved configurations difference and default configurations in use. At operation 824, the thin client replaces the customized configurations stored at the first storage location with the customized configurations at the first restore time point.

Figure 9:
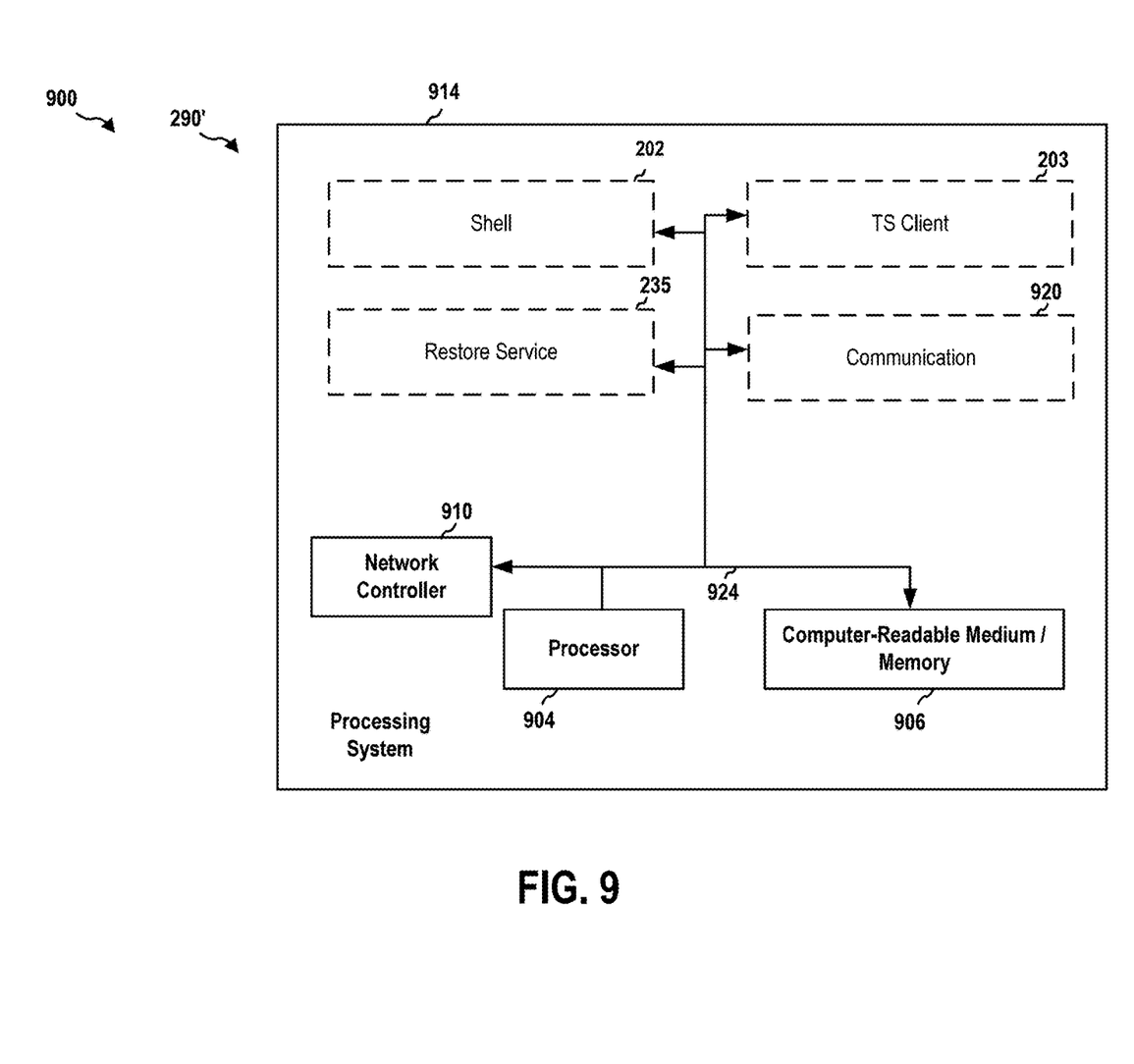
FIG. 9 is a diagram illustrating an example of a hardware implementation for an apparatus employing a processing system.

FIG. 9 is a diagram 900 illustrating an example of a hardware implementation for an apparatus 290' (e.g., the thin client 290) employing a processing system 914. The processing system 914 may be implemented with a bus architecture, represented generally by the bus 924. The bus 924 may include any number of interconnecting buses and bridges depending on the specific application of the processing system 914 and the overall design constraints. The bus 924 links together various circuits including one or more processors and/or hardware components, including the processor 904 the computer-readable medium/memory 906, and the network controller 910. In particular, the computer-readable medium/memory 906 may include the memory 201 and the storage component 214. The bus 924 may also link various other circuits such as timing sources, peripherals, voltage regulators, and power management circuits, which are well known in the art, and therefore, will not be described any further.

The processing system 914 may be coupled to a network controller 910. The network controller 910 provides a means for communicating with various other apparatus over a network. The network controller 910 receives a signal from the network, extracts information from the received signal, and provides the extracted information to the processing system 914, specifically the communication component 920. In addition, the network controller 910 receives information from the processing system 914, specifically the communication component 920, and based on the received information, generates a signal to be sent to the network. The processing system 914 includes a processor 904 coupled to a computer-readable medium/memory 906. The processor 904 is responsible for general processing, including the execution of software stored on the computer-readable medium/memory 906. The software, when executed by the processor 904, causes the processing system 914 to perform the various functions described supra for any particular apparatus. The computer-readable medium/memory 906 may also be used for storing data that is manipulated by the processor 904 when executing software. The processing system further includes at least one of the shell 202, the TS client 203, and the restore service 235. The components may be software components running in the processor 904, resident/stored in the computer readable medium/memory 906, one or more hardware components coupled to the processor 904, or some combination thereof.

The apparatus 290/290' may be configured to include means for performing each of the operations described supra referring to FIG. 8. The aforementioned means may be one or more of the aforementioned components of the apparatus 290 and/or the processing system 914 of the apparatus 290' configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of operating a thin client, comprising:
   capturing, at a first restore time point, customized configurations of the thin client stored at a first storage location of the thin client;
   obtaining first default configurations of the thin client that are in use;
   determining a first difference between the customized configurations and the first default configurations;
   storing the first difference in association with the first restore time point at a second storage location of the thin client;
   obtaining second default configurations of the thin client that replaces the first default configurations;
   determining a default configuration difference between the first default configurations and the second default configurations;
   determining a second difference between the customized configurations and the second default configurations based on the first difference and the default configuration difference; and
   replacing the first difference stored at the second storage location in association with the first restore time point with the second difference.

2. The method of claim 1, further comprising:
   capturing, at each of a plurality of restore time points in addition to the first restore time point, respective customized configurations of the thin client stored at the first storage location;
   determining a respective difference between the respective customized configurations at each of the plurality of restore time points and the first default configurations; and
   storing the respective difference between the respective customized configurations at each of the plurality of restore time points and the first default configurations as a configurations difference in association with that restore time point at a second storage location of the thin client.

3. The method of claim 2, wherein the first restore time point and the plurality of restore time points are time points specified by a predetermined schedule.

4. The method of claim 2, wherein each of the first restore time point and the plurality of restore time points is selected in response to a determination that the customized configurations stored at the first storage location have been modified.

5. The method of claim 1, further comprising:
   determining that the first default configurations have been changed to the second default configurations, wherein the second default configurations are obtained in response to the determination.

6. The method of claim 1, further comprising:
   determining to restore the customized configurations stored at the first storage location to the customized configurations captured at the first restore time point;
   retrieving the second difference stored at the second storage location in association with the first restore time point;
   determining the configurations captured at the first restore time point based on the second configurations difference and the second default configurations; and
   replacing the customized configurations stored at the first storage location with the customized configurations captured at the first restore time point.

7. An apparatus, the apparatus being a thin client, comprising:
   a memory; and
   at least one processor coupled to the memory and configured to:
      capture, at a first restore time point, customized configurations of the thin client stored at a first storage location of the thin client;
      obtain first default configurations of the thin client that are in use;
      determine a first difference between the customized configurations and the first default configurations; and
      store the first difference in association with the first restore time point at a second storage location of the thin client;
      obtain second default configurations of the thin client that replaces the first default configurations;
      determine a default configuration difference between the first default configurations and the second default configurations;
      determine a second difference between the customized configurations and the second default configurations based on the first difference and the default configuration difference; and
      replace the first difference stored at the second storage location in association with the first restore time point with the second difference.

8. The apparatus of claim 7, wherein the at least one processor is further configured to:

capture, at each of a plurality of restore time points in addition to the first restore time point, respective customized configurations of the thin client stored at the first storage location;

determine a respective difference between the respective customized configurations at each of the plurality of restore time points and the first default configurations; and store the respective difference between the respective customized configurations at each of the plurality of restore time points and the first default configurations as a configurations difference in association with that restore time point at a second storage location of the thin client.

9. The apparatus of claim 8, wherein the first restore time point and the plurality of restore time points are time points specified by a predetermined schedule.

10. The apparatus of claim 8, wherein each of the first restore time point and the plurality of restore time points is selected in response to a determination that the customized configurations stored at the first storage location have been modified.

11. The apparatus of claim 7, wherein the at least one processor is further configured to:
determine that the first default configurations have been changed to the second default configurations, wherein the second default configurations are obtained in response to the determination.

12. The apparatus of claim 7, wherein the at least one processor is further configured to:
determine to restore the customized configurations stored at the first storage location to the customized configurations captured at the first restore time point;
retrieve the second difference stored at the second storage location in association with the first restore time point;
determine the configurations captured at the first restore time point based on the retrieved second configurations difference and the second default configurations; and
replace the customized configurations stored at the first storage location with the customized configurations captured at the first restore time point.

13. A non-transitory computer-readable medium storing computer executable code for operating a thin client, comprising code to:
capture, at a first restore time point, customized configurations of the thin client stored at a first storage location of the thin client;
obtain first default configurations of the thin client that are in use;

determine a first difference between the customized configurations and the first default configurations; and
store the first difference in association with the first restore time point at a second storage location of the thin client;
obtain second default configurations of the thin client that replaces the first default configurations;
determine a default configuration difference between the first default configurations and the second default configurations;
determine a second difference between the customized configurations and the second default configurations based on the first difference and the default configuration difference; and
replace the first difference stored at the second storage location in association with the first restore time point with the second difference.

14. The non-transitory computer-readable medium of claim 13, wherein the code is further configured to:
capture, at each of a plurality of restore time points in addition to the first restore time point, respective customized configurations of the thin client stored at the first storage location;
determine a respective difference between the respective customized configurations at each of the plurality of restore time points and the first default configurations; and
store the respective difference between the respective customized configurations at each of the plurality of restore time points and the first default configurations as a configurations difference in association with that restore time point at a second storage location of the thin client.

15. The non-transitory computer-readable medium of claim 14, wherein the first restore time point and the plurality of restore time points are time points specified by a predetermined schedule.

16. The non-transitory computer-readable medium of claim 14, wherein each of the first restore time point and the plurality of restore time points is selected in response to a determination that the customized configurations stored at the first storage location have been modified.

17. The non-transitory computer-readable medium of claim 13, wherein the code is further configured to:
determine that the first default configurations have been changed to the second default configurations, wherein the second default configurations are obtained in response to the determination.

* * * * *